(12) United States Patent
Chen et al.

(10) Patent No.: US 9,148,066 B2
(45) Date of Patent: Sep. 29, 2015

(54) MINIATURIZE VOLTAGE-TRANSFORMING DEVICE

(75) Inventors: Lien-Hsing Chen, Taichung (TW); Li-Hao Liu, Taichung (TW); Cheng-Te Tsai, Taichung (TW)

(73) Assignee: POWER MATE TECHNOLOGY CO., LTD., Taichung (TW)

( * ) Notice: Subject to any disclaimer, the term of this patent is extended or adjusted under 35 U.S.C. 154(b) by 479 days.

(21) Appl. No.: 13/567,527

(22) Filed: Aug. 6, 2012

(65) Prior Publication Data
US 2013/0328543 A1 Dec. 12, 2013

(30) Foreign Application Priority Data

Jun. 6, 2012 (TW) .............................. 101210924 U

(51) Int. Cl.
| | |
|---|---|
| *H01F 5/00* | (2006.01) |
| *H02M 7/00* | (2006.01) |
| *H01F 27/29* | (2006.01) |
| *H02M 3/00* | (2006.01) |
| *H05K 1/14* | (2006.01) |
| *H05K 1/18* | (2006.01) |
| *H05K 3/34* | (2006.01) |
| *H01F 27/40* | (2006.01) |
| *H05K 3/40* | (2006.01) |

(52) U.S. Cl.
CPC ................ *H02M 7/003* (2013.01); *H01F 5/00* (2013.01); *H01F 27/292* (2013.01); *H02M 3/00* (2013.01); *H05K 1/145* (2013.01); *H05K 1/18* (2013.01); *H05K 1/189* (2013.01); *H05K 3/3405* (2013.01); *H01F 27/402* (2013.01); *H01F 2027/297* (2013.01); *H05K 1/144* (2013.01); *H05K 1/148* (2013.01); *H05K 3/3447* (2013.01); *H05K 3/403* (2013.01); *H05K 2201/042* (2013.01); *H05K 2201/047* (2013.01); *H05K 2201/09181* (2013.01); *H05K 2201/1003* (2013.01)

(58) Field of Classification Search
CPC ........................ H01F 5/00; H01F 27/00–27/30
USPC ...................................... 336/65, 83, 200, 232
IPC .................................. H01F 5/00, 27/28, 27/30
See application file for complete search history.

(56) References Cited

U.S. PATENT DOCUMENTS

| | | | | |
|---|---|---|---|---|
| 3,323,091 A * | 5/1967 | Hibbits | ....................... | 336/84 R |
| 3,496,505 A * | 2/1970 | Pedersen et al. | ............... | 336/208 |
| 4,661,792 A * | 4/1987 | Watkins | .......................... | 336/65 |
| 5,293,145 A * | 3/1994 | Rynkiewicz | .................... | 336/65 |
| 8,498,124 B1 * | 7/2013 | Folker et al. | .................. | 361/742 |
| 8,897,029 B2 * | 11/2014 | Kippley et al. | ............... | 361/784 |
| 8,923,010 B2 * | 12/2014 | Parish | ........................... | 361/782 |

* cited by examiner

*Primary Examiner* — Tuyen Nguyen
(74) *Attorney, Agent, or Firm* — Muncy, Geissler, Olds & Lowe, P.C.

(57) ABSTRACT

A miniaturized voltage-transforming device includes a first circuit board and a second circuit board parallel to and separated from each other by a predetermined distance so that there is no physical connection therebetween, and a transformer having a plurality of primary-side pins and a plurality of secondary-side pins, wherein the transformer is located beside the first circuit board and the second circuit board, and has its primary-side pins and secondary-side pins directly or indirectly connected to the first circuit board and the second circuit board physically, so that the transformer is electrically connected to the first circuit board and the second circuit board via the primary-side pins and the secondary-side pins.

8 Claims, 6 Drawing Sheets

MINIATURIZE VOLTAGE-TRANSFORMING DEVICE

BACKGROUND OF THE INVENTION

1. Technical Field

The present invention relates to structures of electronic circuit devices, and more particularly to a miniaturized voltage-transforming device.

2. Description of Related Art

A conventional electronic circuit device depicted in FIG. 11 is, for example, a transformer-based apparatus, which includes a transformer 91 that is deposited on a circuit board 96 and has primary-side and secondary-side pins 92, 93 directly welded on and electrically connected to the circuit board 96, thereby providing voltage-regulating function.

In the foregoing conventional electronic circuit device, the circuit board is merely a planar board, so it can only receive other electronic components with its, at most, upper and lower surfaces. The only way to enlarge the available installation space for additional electronic components is to enlarge the circuit board itself, leading to the increased overall volume of the whole assembly. In view of this, the existing electronic circuit devices are not satisfying the trend toward miniaturization and compactness in the field of electronic products and need to be improved.

SUMMARY OF THE INVENTION

The primary objective of the present invention is to provide a miniaturized voltage-transforming device, which integrates its circuit boards and transformer into a three-dimensional structure, thereby reducing the overall volume of the whole assembly, thereby achieving miniaturization.

For accomplishing the foregoing objective, a miniaturized voltage-transforming device according to the present invention comprises a first circuit board and a second circuit board that are parallel to and separated from each other by a predetermined distance so that there is no physical connection therebetween; and a transformer that has a plurality of primary-side pins and a plurality of secondary-side pins, wherein the transformer is located beside the first circuit board and the second circuit board, and has the primary-side pins and secondary-side pins thereof directly or indirectly connected to the first circuit board and the second circuit board physically, so that the transformer is electrically connected to the first circuit board and the second circuit board via the primary-side pins and the secondary-side pins.

Preferably, the primary-side pins and the secondary-side pins are located at two laterals of the transformer, respectively, and the first circuit board and the second circuit board are deposited beside the two laterals of the transformer, respectively, so that the primary-side pins are at the same side of the first circuit board and are physically connected to the first circuit board, while the secondary-side pins are at the same side of the second circuit board and are physically connected to the second circuit board, thereby forming physical connection between the transformer and the first and second circuit boards, in which the transformer is located between facing surfaces of the first circuit board and the second circuit board.

Preferably, the first circuit board has a plurality of connecting holes and a plurality of conductive members each mounted on one said connecting hole and the primary-side pins are physically connected to the conductive members, while the second circuit board has a plurality of connecting holes and a plurality of conductive members each mounted on one said connecting hole and the secondary-side pins are physically connected to the conductive members.

Preferably, each of the connecting holes is a circular hole.

Preferably, each of the connecting holes is a semicircular hole formed at an edge of the first circuit board or an edge of the second circuit board.

Preferably, the miniaturized voltage-transforming device further comprises a third circuit board and a flexible circuit board, the flexible circuit board being physically mounted on the first circuit board, the third circuit board and the second circuit board, and at least electrically connected to the first circuit board and the second circuit board, in which the first circuit board, the second circuit board and the third circuit board are not physically connected with each other but each two adjacent said circuit boards are mutually pivotable about connection therebetween caused by the flexible circuit board; the transformer being located on the third circuit board and between the first and second circuit boards, and the primary-side pins and the secondary-side pins being physically connected to the flexible circuit board, so as to be electrically connected to the first circuit board and the second circuit board, respectively, whereby the primary-side and secondary-side pins are indirectly, physically connected to the first and second circuit boards.

Preferably, the first circuit board is perpendicular to the third circuit board and the second circuit board is perpendicular to the third circuit board.

Preferably, the first circuit board and the second circuit board are both located below the transformer, and the primary-side and secondary-side pins extend downward to pass through the first circuit board so that ends thereof are physically connected to the second circuit board, while the primary-side pins and the secondary-side pins have parts thereof passing through the first circuit board physically connected to the first circuit board, respectively.

Preferably, the first circuit board and the second circuit board have a plurality of connecting holes and a plurality of conductive rings each mounted on one said connecting hole, in which the primary-side pins and the secondary-side pins pass through the conductive rings of the first circuit board.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE INVENTION

Figure 1:
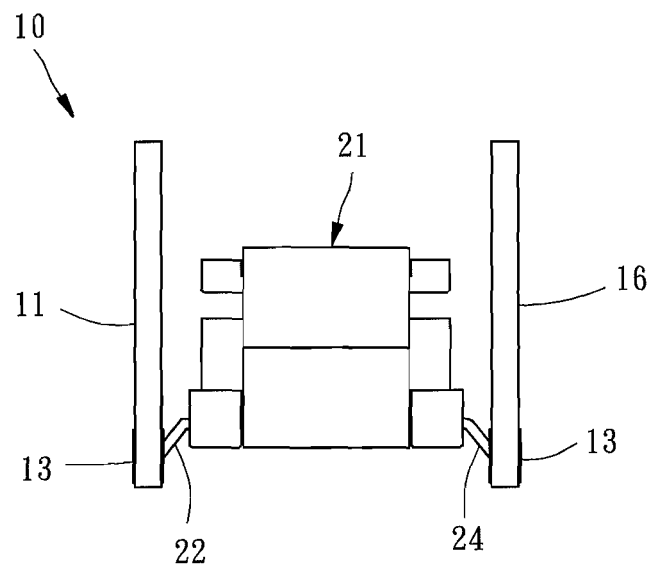
FIG. 1 is a front view of a first preferred embodiment of the present invention.
Figure 2:
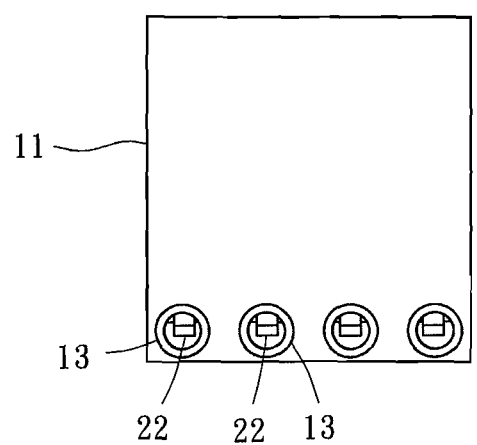
FIG. 2 is a lateral view of the first preferred embodiment of the present invention.
Figure 3:
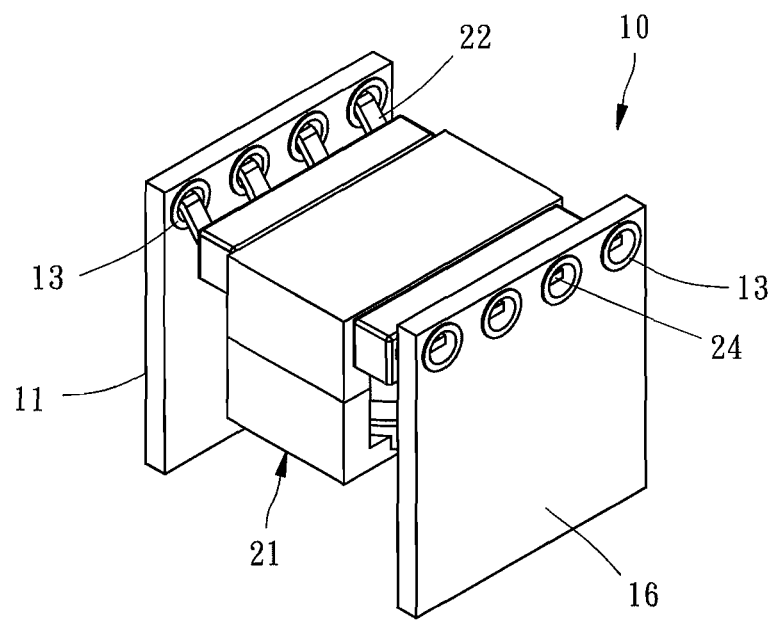
FIG. 3 is a bottom perspective view of the first preferred embodiment, wherein the connecting holes shown are of a first aspect of the present invention.

Referring to FIG. 1 through FIG. 3, in a first preferred embodiment of the present invention, a miniaturized voltage-transforming device 10 primarily comprises a first circuit board 11, a second circuit board 16 and a transformer 21.

The first circuit board 11 and the second circuit board 16 are parallel to and separated from each other by a predetermined distance so that there is no physical connection therebetween.

The transformer 21 has a plurality of primary-side pins 22 and a plurality of secondary-side pins 24. The transformer 21 is located beside the first circuit board 11 and the second circuit board 16 with its primary-side pins 22 and secondary-side pins 24 directly, physically connected to the first circuit board 11 and the second circuit board 16. The transformer 21 is electrically connected to the first circuit board 11 and the second circuit board 16 through the primary-side pins 22 and the secondary-side pins 24.

In the first embodiment, the primary-side pins 22 and the secondary-side pins 24 are located at two laterals of the transformer 21, respectively. The first circuit board 11 and the second circuit board 16 are deposited beside the two laterals of the transformer 21, so that the primary-side pins 22 are at the same side of the first circuit board 11 and are physically connected to the first circuit board 11, while the secondary-side pins 24 are at the same side of the second circuit board 16 and are physically connected to the second circuit board 16. Thereby the primary-side pins 22 and the secondary-side pins 24 are directly connected to the first circuit board 11 and the second circuit board 16, respectively. The transformer 21 is between facing surfaces of the first circuit board 11 and the second circuit board 16, making it look like sandwiched by the first and second circuit boards 11 and 16.

Additionally, in the first embodiment, the first circuit board 11 has a plurality of connecting holes (covered by the conductive members 13 and thus not shown in the drawing) and a plurality of conductive members 13 each mounted on one said connecting hole. The primary-side pins 22 are physically connected to the conductive members 13, by, for example, soldering tin (not shown). The second circuit board 16 has a plurality of connecting holes (covered by the conductive members 13 and thus not shown in the drawing) and a plurality of conductive members 13 each mounted on one said connecting hole. The secondary-side pins 24 are physically connected to the conductive members 13, by, for example, soldering tin. Each of the connecting holes is a circular hole and each of the conductive members 13 is a matching column.

As shown in FIG. 1, the first circuit board 11, the second circuit board 16 and the transformer 21 are arranged into a three-dimensional structure instead of the traditional two-dimensional structure. Other electronic components may be deposited on the first circuit board 11 and the second circuit board 16, so the overall volume of the assembly is miniaturized.

Figure 4:
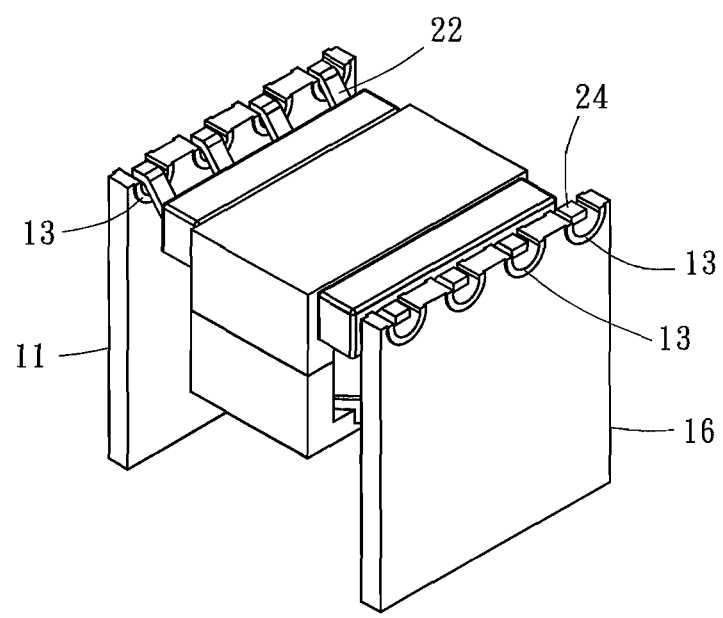
FIG. 4 is another bottom perspective view of the first preferred embodiment, wherein the connecting holes shown are of a second aspect of the present invention.

It is to be noted that while the connecting holes, as described above, are circular, they may be alternatively of other shapes. As shown in FIG. 4, the connecting holes may be semicircular holes formed along edges of the first circuit board 11 and the second circuit board 16. In this case, the conductive members 13 are matching semicircular columns. The alternative shape of the conductive members 13 is also useful to realize their physical connection with the primary-side pins 22 and the secondary-side pins 24.

Figure 5:
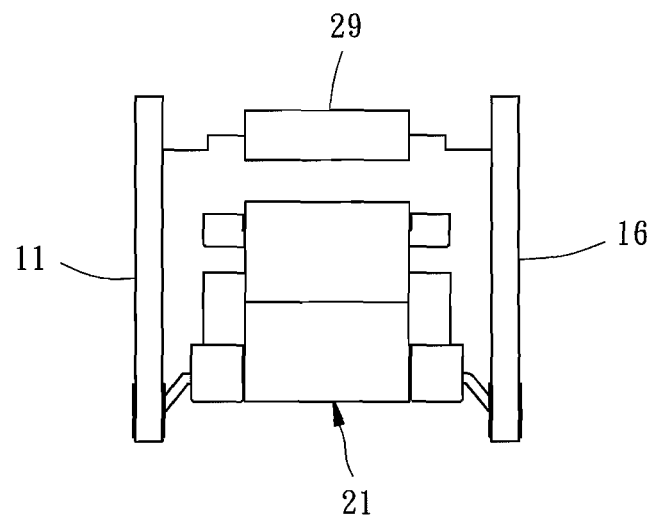
FIG. 5 is an applied view of the first preferred embodiment of the present invention with an additional electronic component installed thereon.

Also to be noted is that, as shown in FIG. 5, in virtue of the connection between the transformer 21 and the first and second circuit boards 11, 16, other electronic components may be arranged between and physically connected to the first and second circuit boards 11, 16. One example of such electronic components is an IC package 29 installed over the transformer 11. Another example of such electronic components is a photocoupler electrically connected to the first circuit board 11 and the second circuit board 16 for voltage regulation.

Moreover, it is understandable that circuit components may be installed onto the first circuit board 11 and the second circuit board 16 as needed for providing any required functions. As the installation is known in the art, the details are omitted herein.

Figure 6:
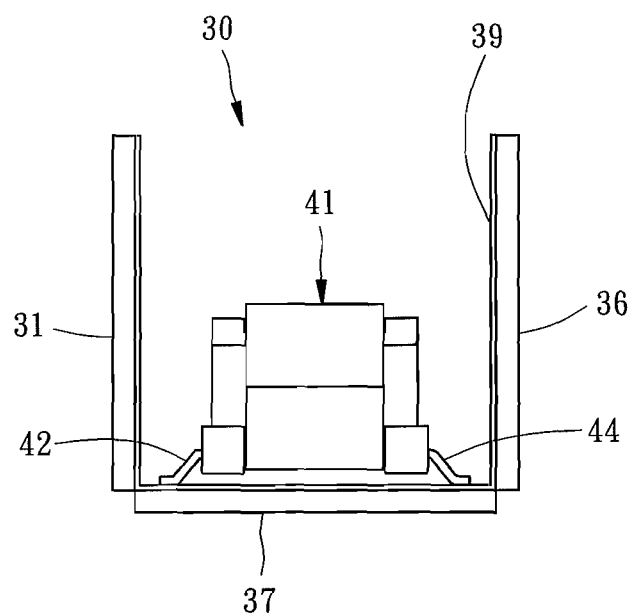
FIG. 6 is a front view of a second preferred embodiment of the present invention.
Figure 7:
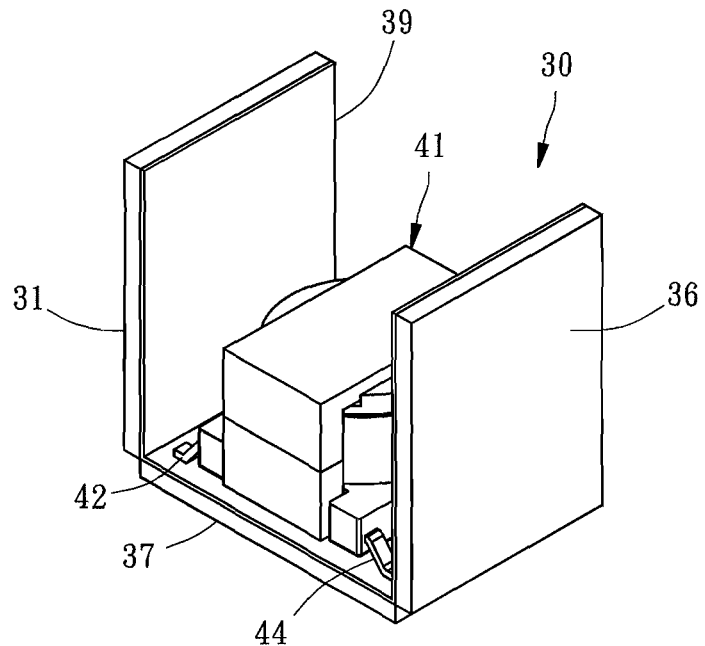
FIG. 7 is a perspective view of the second preferred embodiment of the present invention.

Referring to FIG. 6 and FIG. 7, in a second preferred embodiment of the present invention, a miniaturized voltage-transforming device 30 is similar to its counterpart as described in the first embodiment except for the following difference.

The miniaturized voltage-transforming device 30 of the second embodiment further has a third circuit board 37 and a flexible circuit board 39. The flexible circuit board 39 is physically mounted on the first circuit board 31, the third circuit board 37 and the second circuit board 36, and is electrically connected to the first circuit board 31 and the second circuit board 36, or may be further electrically connected to the third circuit board 37 as needed. The first circuit board 31, the second circuit board 36 and the third circuit board 37 are not physically connected to each other, but each two adjacent said circuit boards are mutually pivotable about a connection therebetween caused by the flexible circuit board 39.

The transformer 41 is deposited on the third circuit board 37 and between the first circuit board 31 and the second circuit board 36. The primary-side pins 42 and the secondary-side pins 44 are physically connected to the flexible circuit board 39, and in turn electrically connected to the first circuit board 31 and the second circuit board 36. Thereby physical connection is established between the primary-side and secondary-side pins 42, 44 and the first and second circuit boards 31, 36. Therein, the first circuit board 31 is perpendicular to the third circuit board 37 while the second circuit board 36 is perpendicular to the third circuit board 37. In practical use, a plurality of connecting pads (not shown) are provided on the flexible circuit board 39 for the primary-side pins 42 and the secondary-side pins 44 to be soldered therewith. As the soldering technology is known in the art, the details are omitted herein.

Thereby, the second embodiment can also accomplish the desired three-dimensional structure of the first circuit board 31, the second circuit board 36 and the transformer 41, so the overall volume of the assembly is miniaturized.

Figure 8:
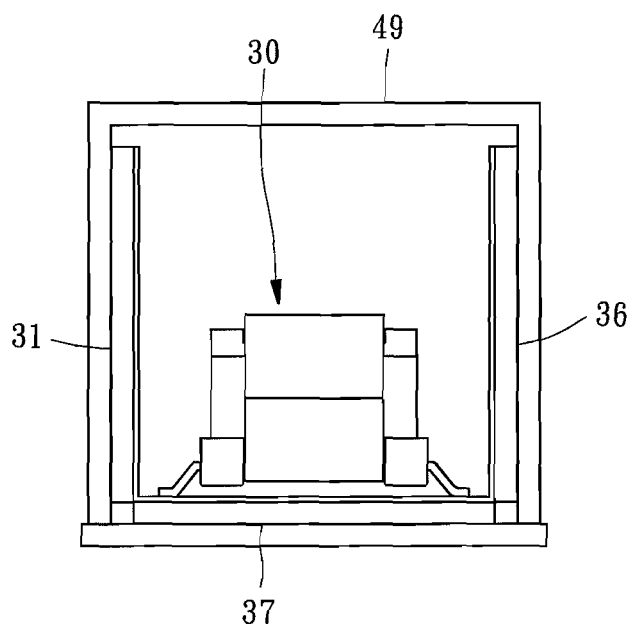
FIG. 8 is an applied view of the second preferred embodiment of the present invention, wherein the transformer and circuit boards are packed in an insulating casing.

Furthermore, in practical use, as shown in FIG. 8, an insulating casing 49 may be used to cover the first, second and third circuit boards 31, 36 and 37, thereby holding the first, second and third circuit boards 31, 36 and 37 in position and maintaining the relative special relation among them.

The other details and effects of the second embodiment are similar to those of the first embodiment and no repeated description is provided herein.

Figure 9:
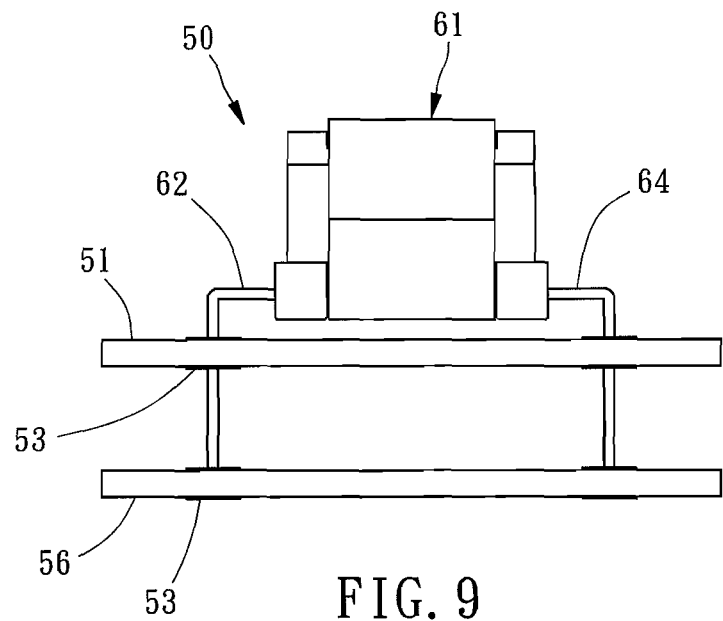
FIG. 9 is a front view of a third preferred embodiment of the present invention.
Figure 10:
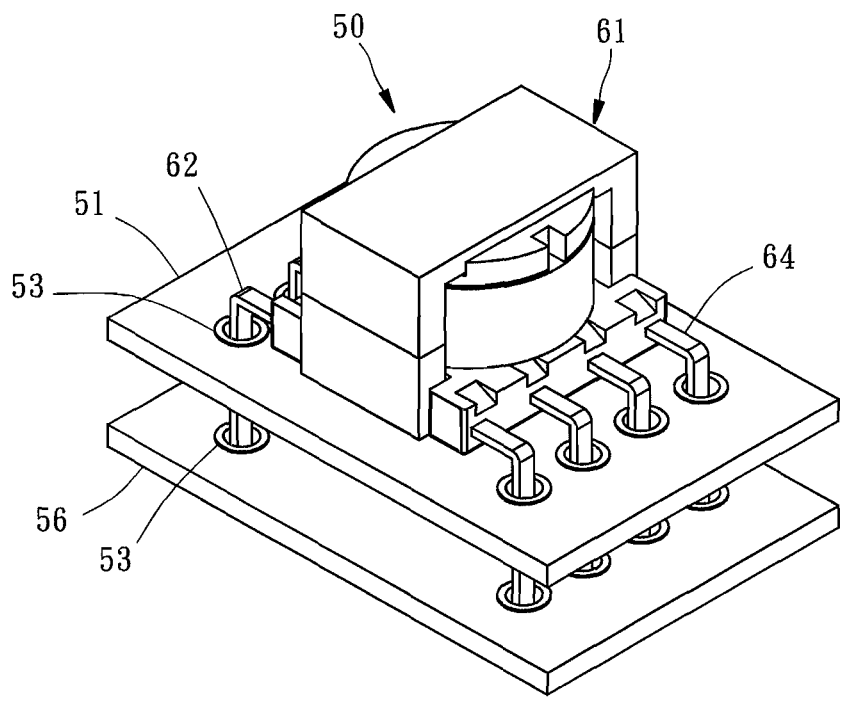
FIG. 10 is a perspective view of the third preferred embodiment of the present invention.
Figure 11:
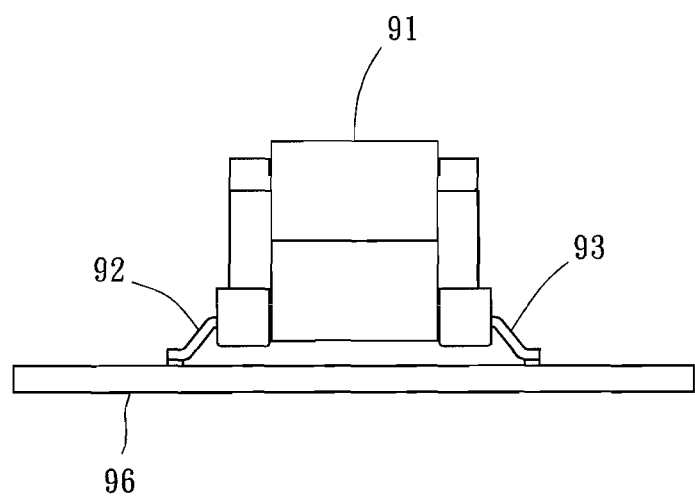
FIG. 11 is a front view of a conventional electronic circuit device.

Referring to FIG. 9 and FIG. 10, in a third embodiment of the present invention, a miniaturized voltage-transforming device 50 is similar to its counterpart as described in the first embodiment except for the following difference.

The first circuit board 51 and the second circuit board 56 are both located below the transformer 61. The first circuit board 51 and the second circuit board 56 have a plurality of connecting holes (covered by the conductive rings 53 and thus not shown in the drawing) and a plurality of conductive rings 53 each mounted on one said connecting hole. The primary-side pins 62 and the secondary-side pins 64 extend downward to pass through the conductive rings 53 of the first circuit board 51 so that their ends are physically connected to the conductive rings 53 of the second circuit board 56. Also, the primary-side pins 62 and the secondary-side pins 64 have their parts passing through the first circuit board 51 physically connected to the first circuit board 51.

Thereby, the third embodiment can also accomplish the desired three-dimensional structure of the first circuit board 51, the second circuit board 56 and the transformer 61, so the overall volume of the assembly is miniaturized.

The other details and effects of the third embodiment are similar to those of the first embodiment and no repeated description is provided herein.

What is claimed is:

1. A miniaturized voltage-transforming device, comprising:
   a first circuit board and a second circuit board that are parallel to and separated from each other by a predetermined distance so that there is no physical connection therebetween; and
   a transformer that has a plurality of primary-side pins and a plurality of secondary-side pins, wherein the transformer is located beside the first circuit board and the second circuit board, and has the primary-side pins and secondary-side pins thereof directly or indirectly connected to the first circuit board and the second circuit board physically, so that the transformer is electrically connected to the first circuit board and the second circuit board via the primary-side pins and the secondary-side pins,
   wherein the primary-side pins and the secondary-side pins are located at two laterals of the transformer, respectively, and the first circuit board and the second circuit board are deposited beside the two laterals of the transformer, respectively, so that the primary-side pins are at the same side of the first circuit board and are physically connected to the first circuit board, while the secondary-side pins are at the same side of the second circuit board and are physically connected to the second circuit board, thereby forming physical connection between the transformer and the first and second circuit boards, in which the transformer is located between facing surfaces of the first circuit board and the second circuit board,
   wherein the first circuit board has a plurality of connecting holes and a plurality of conductive members each mounted on one said connecting hole and the primary-side pins are physically connected to the conductive members, while the second circuit board has a plurality of connecting holes and a plurality of conductive members each mounted on one said connecting hole and the secondary-side pins are physically connected to the conductive members,
   wherein each of the connecting holes is a semicircular hole formed at an edge of the first circuit board or an edge of the second circuit board.

2. The miniaturized voltage-transforming device of claim 1, further comprising a third circuit board and a flexible circuit board, the flexible circuit board being physically mounted on the first circuit board, the third circuit board and the second circuit board, and at least electrically connected to the first circuit board and the second circuit board, in which the first circuit board, the second circuit board and the third circuit board are not physically connected with each other but each two adjacent said circuit boards are mutually pivotable about connection therebetween caused by the flexible circuit board; the transformer being located on the third circuit board and between the first and second circuit boards, and the primary-side pins and the secondary-side pins being physically connected to the flexible circuit board, so as to be electrically connected to the first circuit board and the second circuit board, respectively, whereby the primary-side and secondary-side pins are indirectly, physically connected to the first and second circuit boards.

3. The miniaturized voltage-transforming device of claim 2, wherein the first circuit board is perpendicular to the third circuit board and the second circuit board is perpendicular to the third circuit board.

4. The miniaturized voltage-transforming device of claim 1, wherein the first circuit board and the second circuit board are both located below the transformer, and the primary-side and secondary-side pins extend downward to pass through the first circuit board so that ends thereof are physically connected to the second circuit board, while the primary-side pins and the secondary-side pins have parts thereof passing through the first circuit board physically connected to the first circuit board, respectively.

5. The miniaturized voltage-transforming device of claim 4, wherein the first circuit board and the second circuit board have a plurality of connecting holes and a plurality of conductive rings each mounted on one said connecting hole, in which the primary-side pins and the secondary-side pins pass through the conductive rings of the first circuit board.

6. The miniaturized voltage-transforming device of claim 5, wherein each of the connecting holes is a circular hole.

7. The miniaturized voltage-transforming device of claim 5, wherein each of the connecting holes is a semicircular hole formed at an edge of the first circuit board or an edge of the second circuit board.

8. The miniaturized voltage-transforming device of claim 1, further comprising a photocoupler electrically connected to the first circuit board and the second circuit board.

* * * * *